United States Patent [19]

Schwanke et al.

[11] Patent Number: 5,083,299
[45] Date of Patent: Jan. 21, 1992

[54] TESTER FOR MEASURING SIGNAL PROPAGATION DELAY THROUGH ELECTRONIC COMPONENTS

[75] Inventors: Robert E. Schwanke, Camarillo; James C. Icuss, Escondido, both of Calif.

[73] Assignee: Unisys Corporation, Blue Bell, Pa.

[21] Appl. No.: 572,281

[22] Filed: Jul. 16, 1990

[51] Int. Cl.⁵ .......................... G04F 8/00; G01R 15/12
[52] U.S. Cl. .................................. 368/113; 324/73.1; 331/57
[58] Field of Search ............................... 368/113–120; 324/73 R, 73 AT, 310; 331/57

[56] References Cited

U.S. PATENT DOCUMENTS

| | | | |
|---|---|---|---|
| 4,587,480 | 5/1986 | Zasio | 324/310 |
| 4,688,947 | 8/1987 | Blaes et al. | 368/120 |
| 4,771,251 | 9/1988 | Allen et al. | 331/57 |
| 4,858,208 | 8/1989 | Swapp | 368/118 |
| 4,878,209 | 10/1989 | Bassett et al. | 368/113 |
| 4,890,270 | 12/1989 | Griffith | 368/113 |

Primary Examiner—Vit W. Miska
Attorney, Agent, or Firm—Charles J. Fassbender; Mark T. Starr

[57] ABSTRACT

A tester for measuring the time with which a signal propagates through an electronic component is comprised of a ring oscillator in which pulses are periodically generated and propagated around a loop. Within this loop, a fixture is disposed for selectively holding either the electronic component that is to be tested, or a shorting plug, in a removable fashion. Pulses from the ring oscillator propagate through the fixture, and their period reflects whether the component/shorting plug is being held. Coupled to the loop is a timing circuit which generates a timing signal each time it receives a predetermined number of the pulses on the loop. Using this timing signal, the signal propagation delay through the electronic component is determined substantially more accurately than that which is attainable by measuring propagation delay through the component directly.

11 Claims, 5 Drawing Sheets

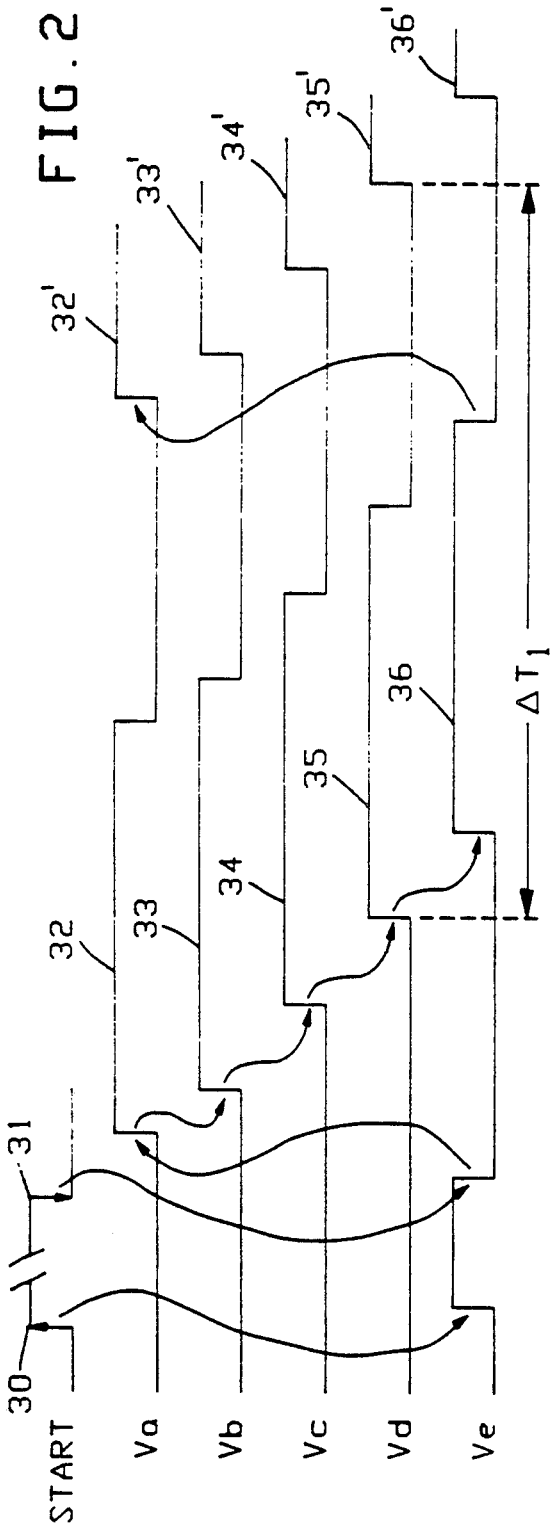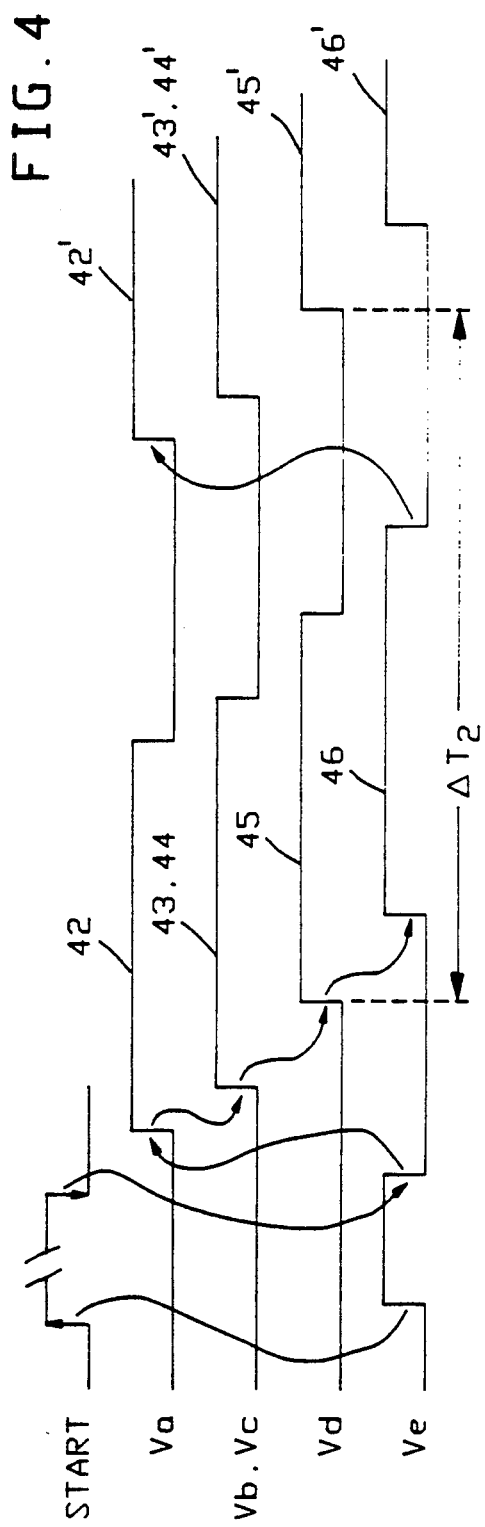

FIG.5 eq.1~ MEASURE $(\Delta T_1)N \pm \epsilon$ eq.2~ MEASURE $(\Delta T_2)N \pm \epsilon$ eq.3~ CACULATE $(\Delta T_1)N \pm \epsilon - (\Delta T_2)N \pm \epsilon$
$= (*_{CHIP})N \pm 2\epsilon$ eq.4~ CACULATE $*_{CHIP} \pm \frac{2\epsilon}{N} \rightarrow *_{CHIP}$ AS $N \rightarrow \infty$ eq.5~ REPEAT 1 THRU 4 FOR EACH CHIP OUTPUT eq.5~ COMPARE ALL $*_{CHIPS}$. ACCEPT/REJECT CHIP

FIG.6 eq.11~ CHIP DELAY=50ps
SCOPE ACCURACY =± 500ps
LOOP DELAY w/o CHIP=300ps
N=10,000 eq.12~ $(\Delta T_1)N \pm \epsilon$ =(350ps)(10,000)± 500ps
=3,500,500ps MAX & 3,499,500psMIN eq.13~ $(\Delta T_2)N \pm \epsilon$ =(300ps)(10,000)± 500ps
=3,000,500ps MAX & 2,999,500psMIN eq.14A~ eq12 MAX-eq13 MIN = 501,000ps eq.15A~ $\frac{eq.4A}{N}$ = 50.1ps eq.14B~ eq12 MIN-eq13 MAX = 499,000ps eq.15B~ $\frac{eq.4B}{N}$ = 49.9ps $$S1 = (\Delta T_1) N \pm \epsilon$$

eq.21~ CHIP DELAY FOR VARIOUS PATHS=50ps,51ps,62ps
SCOPE ACCURACY =± 500ps
LOOP DELAY w/o CHIP=300ps
N=10,000 eq.22A~ $(\Delta T_1) N \pm \epsilon$ =(350ps)(10,000)± 500ps
=3,500,500ps MAX & 3,499,500ps MIN
→ 3500 MAX, 3499 MIN eq.22B~ $(\Delta T_1) N \pm \epsilon$ =(351ps)(10,000)± 500ps
=3,510,500ps MAX & 3,509,500ps MIN
→ 3510 MAX, 3509 MIN eq.22C~ $(\Delta T_1) N \pm \epsilon$ =(362ps)(10,000)± 500ps
=3,620,500ps MAX & 3,619,500ps MIN
→ 3620 MAX, 3619 MIN

1

TESTER FOR MEASURING SIGNAL PROPAGATION DELAY THROUGH ELECTRONIC COMPONENTS

BACKGROUND OF THE INVENTION

This invention relates to test equipment for electronic components; and in particular, it relates to equipment for measuring the delay with which a digital signal propagates through an integrated circuit logic chip.

Each integrated circuit logic chip has at least one input terminal, at least one output terminal, and multiple logic gates which interconnect the input terminals to the output terminals. When a digital signal is applied to an input terminal, it propagates through the logic gates and generates an output signal on one or more output terminals. Often, the speed at which the signal propagates from an input terminal to an output terminal is extremely important. However, as logic gates become faster and faster in their operation, that propagation speed becomes more and more difficult to measure with a high degree of accuracy.

One example of an integrated circuit logic chip in which propagation speed is critical is a clock distribution chip. It receives a clock signal on an input terminal and replicates that clock signal on multiple output terminals. Such a chip is used in multichip computers to provide respective clock signals to multiple computer chips. Output terminal #1 of the clock distribution chip is coupled to a subset of computer chips #1A, #1B, .. .; output terminal #2 of the clock distribution chip is coupled to another subset of computer chips #2A, #2B, ...; etc. The number of chips in each subset is typically limited to about eight. In such a multichip computer, the propagation delays from the input terminal of the clock distribution chip to that chips output terminals must be closely matched; otherwise, errors due to logic races will occur.

A logic race can be visualized by considering the case where the propagation delay from the input terminal to output terminal #1 of the clock distribution chip is very short in comparison to the propagation delay to output terminal #2. In that case, computer chip #1A will be clocked relatively early in comparison to computer chip #2A. When computer chip #1A is clocked, output signals from that chip will change. And, if some of those output signals are sent to computer chip #2A, those signals may change at the same time that the computer chip #2A receives its clock signal.

To avoid the above described logic race, it is desirable to be able to very accurately measure the propagation delay from the input terminal of the clock distribution chip to each of its output terminals. However, any such measurement will always have a certain accuracy error associated with it which depends on the instrument that is used to make the measurement. And if the propagation delay through the chip is so short that it approaches the accuracy of the delay measuring instrument, the problem which is then posed is how can the propagation delay even be measured.

Accordingly, a primary object of the invention is to provide an integrated circuit: logic chip tester in which the above described problem is overcome.

BRIEF SUMMARY OF THE INVENTION

In accordance with the present invention, a tester for measuring the time with which a signal propagates through an integrated circuit logic chip is comprised of a ring oscillator in which pulses are periodically generated and propagated around a loop. Within this loop, a fixture is disposed for selectively holding either the integrated circuit chip or a shorting plug in a removable fashion; and, pulses propagate through the fixture and through the chip/shorting plug. Coupled to the loop is a timing circuit which generates a timing signal each time it receives a predetermined number of the pulses on the loop.

Using this tester, the propagation delay through the integrated circuit chip is determined by a three step process. These steps are: a) measuring the period of the timing signals S1 from the timing circuit which occur when the integrated circuit chip is inserted in the fixture; b) remeasuring the period of the timing signal S2 from the timing circuit when the integrated circuit chip is removed from the fixture and replaced with a shorting plug; and c) calculating the quantity S1 minus S2 divided by N. This yields a propagation delay measurement for the IC chip which is substantially more accurate than that which is attained by measuring the propagation delay through the chip directly.

BRIEF DESCRIPTION OF THE DRAWINGS

Various features and advantages of the invention are described herein in conjunction with the accompanying drawings wherein:

FIG. 2 is a timing diagram which shows the voltage waveforms that occur at various nodes in the FIG. 1 circuit;

FIG. 4 is a timing diagram which shows the voltage waveforms that occur on various nodes in the FIG. 3 circuit;

FIG. 5 is a set of equations which describe the steps by which the circuits of FIGS. 1 and 3 are used to determine the propagation delay through an integrated circuit chip;

FIG. 6 is a set of equations which are a numerical example of the equations of FIG. 5;

DETAILED DESCRIPTION OF THE INVENTION

Figure 1:
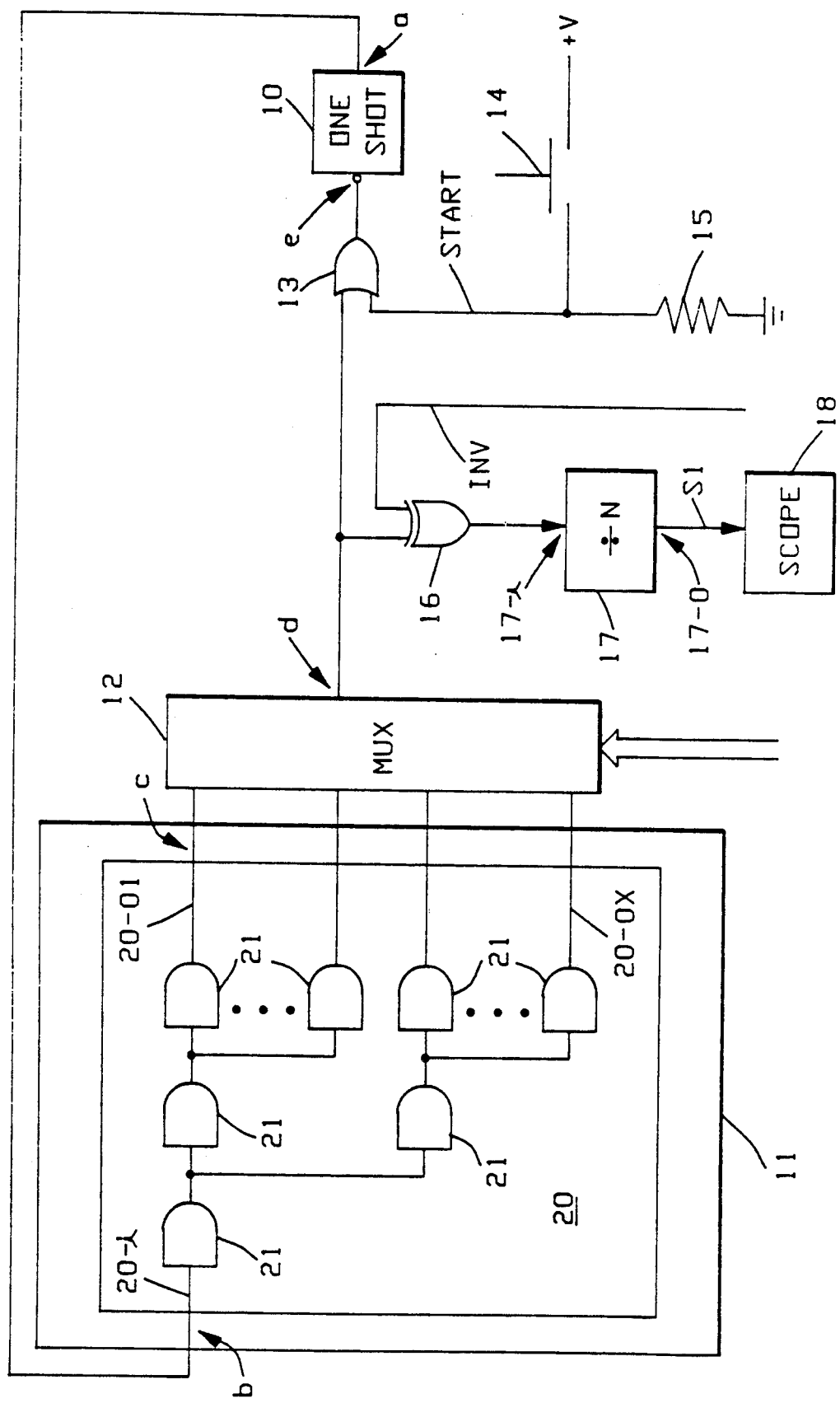
FIG. 1 is a detailed circuit diagram of an integrated circuit logic chip tester which is constructed according to the invention and is which is performing step a) above.

Referring now to FIG. 1, it shows the details of an integrated circuit logic chip tester (IC tester) which is constructed according to the invention. This IC tester includes a one shot multi-vibrator 10, an electromechanical fixture 11, a multiplexor 12, an OR gate 13, a push button switch 14, a resistor 15, an EXCLUSIVE OR gate 16, a divide by N counter 17, and an oscilloscope 18. All of these components 10-18 are interconnected as illustrated.

Fixture 11 holds an integrated circuit chip 20 which is to be tested. Chip 20 has an input terminal 20-i and several output terminals 20-01 thru 20-OX. These terminals are interconnected by multiple AND gates 21 as shown. By the operation of the FIG. 1 IC tester, the time which it takes a pulse to propagate from the input terminal through the AND gates 21 to the output terminals is accurately determined.

Components 10, 11, 12, and 13, together with chip 20, are interconnected in a loop such that they form a ring oscillator. Various nodes within this loop are identified in FIG. 1 via the letters "a", "b", "c", "d", and "e". FIG. 2 shows the corresponding voltage waveforms Va thru Ve which occur on the nodes "a" thru "e".

To initiate the operation of the ring oscillator 10-13, the switch 14 is momentarily pressed and then released. When switch 14 is pressed, the START signal goes high as indicated by referenced numeral 30 in FIG. 2; and when switch 14 is released, the START signal goes low as indicated by referenced numeral 31. Transition 31 of the START signal passes through the OR gate 13 to node "e" of the one shot multivibrator 10. Node "e" is the multivibrator's control node; and in response to transition 31, the multivibrator generates a positive pulse 32 on its output terminal "a" as indicated in FIG. 2.

Pulse 32 sequentially propagates through nodes "b", "c", "d", and "e" as indicated respectively by referenced numerals 33, 34, 35, and 36 in FIG. 2. In response to the high to low transition of the pulse 36 on node "e", the one shot multivibrator 10 generates another pulse 32' on its output terminal "a". Then, pulse 32' travels through nodes "b", "c", "d", and "e" as indicated by referenced numerals 33' thru 36'.

Thus by the above described means, a periodic sequence of pulses is sent through the integrated circuit chip 20 which is being tested. Those pulses have a period which is indicated as $\Delta T_1$ in FIG. 1. Period $\Delta T_1$ equals the width of one pulse from the one shot multivibrator 10, plus the total time delay with which the high to low transition of that pulse travels from node "a" around the loop "b", "c", "d", "e" and back to node "a".

All of the pulses on the loop pass from node "d" to the EXCLUSIVE OR gate 16. Gate 16 also receives a control signal INV. When signal INV is low, the pulses on node "d" pass through gate 16 to a clock input 17a of the divide by N counter 17. In response, the counter 17 generates a periodic signal S1 on its output 17-0, and the period of that signal S1 is N times $\Delta T_1$. Signal S1 is sent to the oscillosignal scope 18 where its period is measured with a certain error of $\pm \epsilon$.

Figure 3:
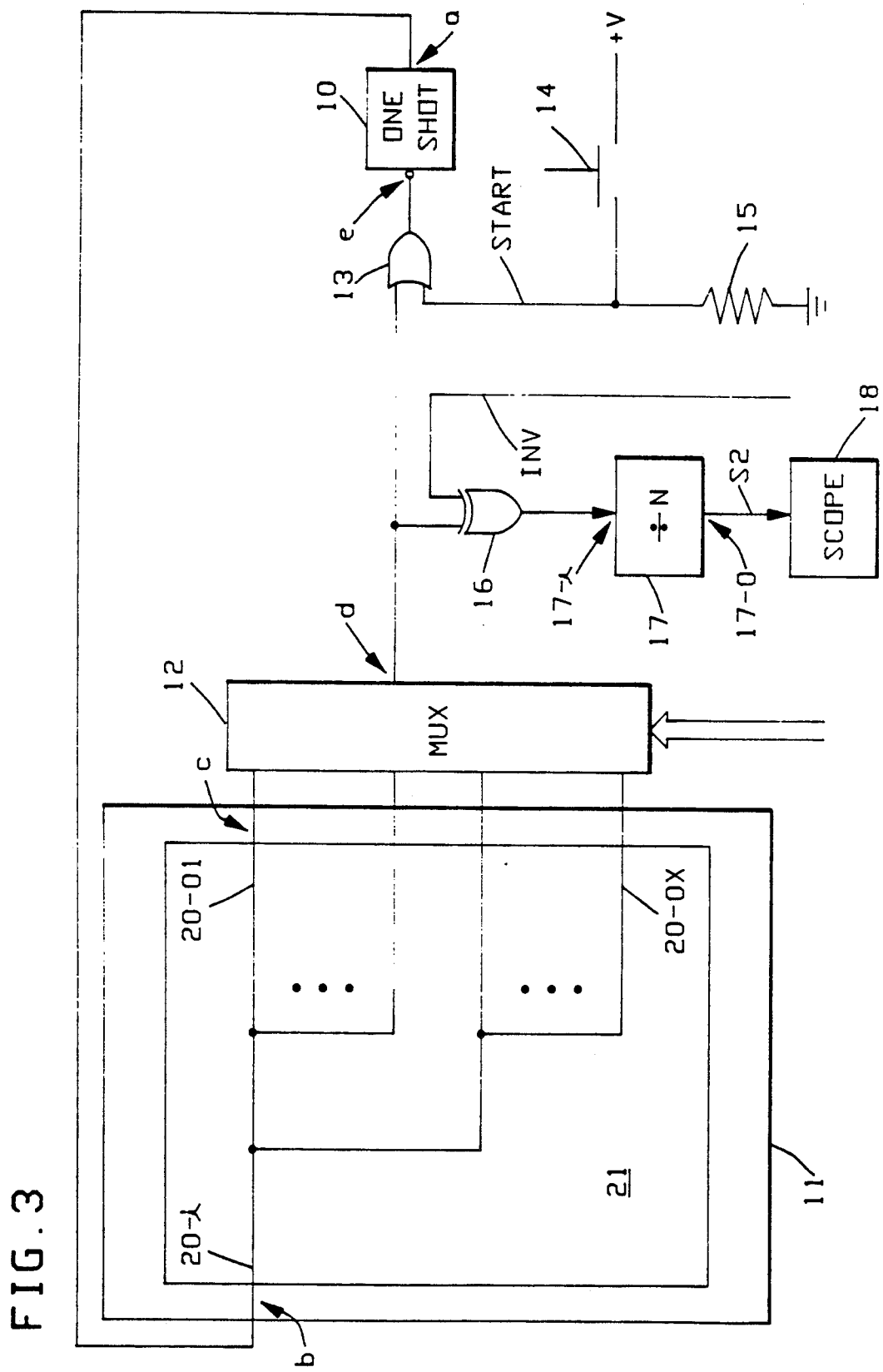
FIG. 3 is a detailed circuit diagram of an integrated circuit logic chip tester which is the same as that of FIG. 1 but which is performing step b) above.

After the above measurement is made, the chip 20 is removed from the fixture 11; and, a shorting plug 21 is inserted in the fixture. This is indicated in FIG. 3. Shorting plug 21 has an input terminal 21-i and several output terminals 21-01 thru 21-OX which respectively correspond to the input terminal and output terminals of the integrated circuit chip 20.

Components 10, 11, 12, and 13, together with the shorting plug 21, form a ring oscillator. To initiate the operation of this ring oscillator, the switch 14 is momentarily pressed and released. When the switch is released, a periodic sequences of pulses 42-46, 42'-46', etc. propagates thru nodes "a", "b", "c", "d", and "e" as indicated in FIG. 4.

Each of the FIG. 4 pulses has a period which is indicated in that figure as $\Delta T_2$. Period $\Delta T_2$ equals the width of one pulse from node "a" of the multivibrator 10, plus the total time delay with which a high to low transition of that pulse travels from node "a" around the loop back to node "a". Period $\Delta T_2$ is shorter than $\Delta T_1$ since the delay through the shorting plug 21 between nodes "b" and "c" is essentially zero.

All of the FIG. 4 pulses pass through the EXCLUSIVEOR gate 16 to the counter 17. In turn the counter 17 generates a signal S2 on its output 17-0 which has a period of N times $\Delta T_2$. That period is measured by the scope 18 with same accuracy $\pm \epsilon$ as $\Delta T_1$.

How the measured period of the S1 and S2 signals are used to determine the delay through chip 20 is indicated in FIG. 5. There equation 1 restates what was said above about measuring the period of the signal S1 from counter 17 in the FIG. 1 circuit; and equation 2 restates what was said above about measuring the period of the signal S2 from counter 17 in the FIG. 3 circuit.

Subtracting the measured period of equation 2 from the measured period of equation 1 yields equation 3. It states that the result of such a subtraction is N times the delay with which a high-to-low signal transition propagates through chip 20, plus or minus an accuracy of $2\epsilon$. This result occurs because the only difference between the periods $\Delta T_1$ and $\Delta T_2$ is the time delay through chip 20.

Next, dividing equation 3 by the parameter N from counter 17 yields equation 4. It states that such a calculation gives the time delay of a high-to-low transition through the chip 20, plus or minus an error of $2\epsilon$ divided by N. Since N is the error's denominator, the error reduces to zero as the parameter N of the counter 17 is increased.

By repeating the steps of equations 1 thru 4 on each of the output terminals of the chip 20, the respective time delays with which a high-to-low signal transition propagates from the input terminal to those output terminals can be accurately determined. This is stated by equation 5. Thereafter, as equation 6 states, the chip 20 is accepted or rejected based on whether or not the respective delays are within a certain predetermined range.

To more fully appreciate the above described test equipment and its use, a numerical example is given in FIG. 6. In this example, the time delay from the input terminal of chip 20 to one of its output terminals is assumed to be 50 picoseconds; the accuracy with which a period of a signal can be measured by the scope 18 is assumed to be 500 picoseconds; the period $\Delta T_2$ of the pulses which are generated by the FIG. 3 circuit is assumed to be 300 picoseconds; and the parameter N of the counter 17 is assumed to 10,000. This is stated by equation 11. Here, an important point is that the chip delay which is to be measured is much smaller than the accuracy of the scope that will be used to do the measuring!

Applying the numbers of equation 11 in FIG. 6 to equation 1 of FIG. 5 yields equation 12. It gives the maximum and minimum values with which the period of the output signal S1 from counter 17 is measured utilizing the scope 18. Similarly, applying the numbers of equation 11 to equation 2 yields equation 13. It gives the maximum and minimum values with which the period of the output signal S2 from counter 17 is measured utilizing the scope 18.

Next, the minimum measured $\Delta T_2$ as given by equation 13 is subtracted from the maximum measured $\Delta T_1$ as given by equation 12. This is one worst case scenario of equation 3, and it yields equation 14A. Then, dividing equation 14A by the counter parameter N yields the measured time delay through the chip 20. This is given by equation 15A. It shows that the worst case measured chip delay is within 0.1 picoseconds of the actual chip delay; even though, the scope accuracy is ±500 picoseconds!

As another worst case scenario, the maximum $\Delta T_2$ period as measured by equation 13 is subtracted from the minimum $\Delta T_1$ period as measured by equation 12. This is done via equation 14B. Then, equation 14B is divided by the counter parameter N as given by equation 15B. This yields the worst case measured chip delay which again is within 0.1 picoseconds of the actual chip delay.

Throughout the above description, the control signal INV to the EXCLUSIVE - OR gate 16 was assumed to be low. If, however, signal INV is set high, then gate 16 inverts the pulses which it receives from node "d". Consequently, counter 17 counts the high-to-low transition of the pulses on node "d", and it generates the timing signals S1 and S2 after N of those transitions have occurred. Thus, by performing the steps of FIG. 5 while signal INV is high, the time delay of a high-to-low signal transition through the chip 20 is determined.

Figures 7, 8:
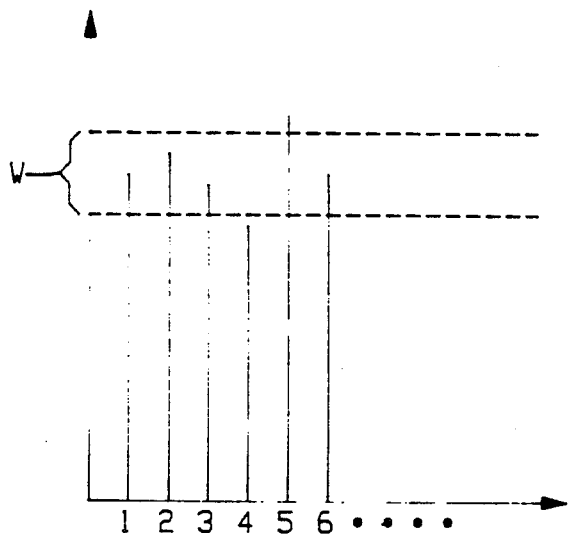
FIG. 7 is a graph which illustrates an alternative method by which the FIG. 1 integrated circuit tester can be operated; and, FIG. 8 is a set of equations which are a numerical example of the FIG. 7 method.

Referring now to FIGS. 7 and 8, they show a modification of the above described chip testing process. With this modification, only the circuitry of FIG. 1 is used, (the circuitry of FIG. 3 is eliminated). As an initial step, the period of the signal S1 from the output of the counter 17 is measured while each of the output terminals of chip 20 is selected. This is indicated in graph form in FIG. 7 wherein the numbers 1, 2, 3, . . . on the horizontal axis correspond to the output terminals of the chip 20; and the quantity $\Delta(T_1) N \pm \epsilon$ on the vertical axis indicates the corresponding period that was measured for the S1 signal.

After the signal S1 periods are measured, they are examined to determine if they all fall within a certain window W. Increasing the size of the window W increases the amount of skew which signals from chip 20 are allowed to have; and vice versa. Note that the window W does not specify the actual skew of the chip 20 signals; it instead is an indirect measure or metric of that skew.

Preferably, the number N from the counter 17 times the period $\Delta T_1$ of each pulse that is sent to the counter is substantially larger then the scope measuring tolerance of $\pm \epsilon$. This constraint makes the tolerance of $\pm \epsilon$ insignificant in comparison to the quantity $(\Delta T_1) \times N$. As a result only the most significant digits of the measured S1 periods from the counter 17 need to be plotted in FIG. 7 and examined to determine if they are within the window W. That is, all digits in the measured S1 periods which are of the same significance as the measurement error of the scope 18 can be truncated.

A numerical example of the above process is given in FIG. 8. In this example, the delay from the input terminal of chip 20 to three of the chips output terminals is assumed to be 50 picoseconds, 51 picoseconds, and 62 picoseconds. This is given by equation 21. Other assumed parameters in this example are that the accuracy with which the period of the signal S1 can be measured by the scope 18 is ±500 picoseconds; the period of the pulses $\Delta T_2$ is 300 picoseconds; and N is 10,000. These are the same parameters that were assumed in the example of FIG. 6.

Equation 22A in FIG. 8 gives the maximum and minimum values which will be measured as the period of the signal S1 when the chip output terminal with the 50 picosecond delay is in the FIG. 1 ring oscillator. Similarly, equation 22B gives the maximum and minimum values which will be measured as the period of the signal S1 when the chip output terminal whose delay is 51 picoseconds is inserted in the ring oscillator; and equation 22C gives the maximum and minimum values which will be measured as the period of signal S1 when the chip output terminal whose delay is 62 picoseconds is inserted in the ring oscillator.

Each of the measured periods as given by equation 22A, 22B, and 22C is 7 digits long. However, the three least significant digits are the same significance as the accuracy of the scope. Thus, the measured periods for the signal S1 can be truncated such that only the four most significant digits are used in the FIG. 7 plot.

This truncation is indicated in equations 22A, 22B, and 22C by a set of arrows. In equation 22C, the truncated measured S1 time periods are 3500 max and 3499 min. These measured truncated numbers are accurate metrics of signal propagation delay through the chip 20 since the measurement error causes the ideal metric of 3500 to change by just 0001.

When the above described process is applied to an actual chip whose signal propagation delays are unknown, then the ideal metrics for that chip will also be unknown. However, that ideal metric can be determined statistically by making the truncated S1 measurements on the output terminals of a large number of chips, and sending the ideal metric to the average measured truncated S1 metric. Window W can then be set as desired about that ideal value.

Various preferred embodiments of the invention have now been described in detail. In addition however, many changes and modifications can be made to these details without departing from the nature and spirit of the invention. For example, the scope 18 in FIGS. 1 and 3 may be replaced with any electronic module that can measure the period of the S1 and S2 signals. Also, the chip 20 through which delays are measured can be replaced with any electronic component that will pass the pulses 42–46 of FIG. 2. Accordingly, it is to be understood that the invention is not limited to the above described details but is defined by the appended claims.

What is claimed is:

1. A tester, for precisely measuring the time with which a signal propagates through an integrated circuit chip, said tester being comprised of:

a pulse generator having a control terminal for receiving a control signal, and having an output terminal on which a pulse is generated in response to said control signal;

a feedback circuit which couples each pulse from said output terminal back to said control terminal; said feedback circuit together with said pulse generator forming a ring oscillator in which each pulse on said control terminal causes another pulse to be generated on said output terminal;

a fixture, within said feedback circuit, for holding said integrated circuit chip in a removable fashion such that pulses from said output terminal propagate through said fixture and said chip to said control terminal; and, a timing circuit, coupled to said feedback circuit, for measuring the time interval between a multitude of said pulses from said feedback circuit with a certain tolerance that is larger than said integrated circuit chip, and for dividing the measured time interval by the number of pulses in said multitude.

2. A tester according to claim 1 wherein the number of pulses in said multitude multiplied by the time period from one pulse to the next pulse is substantially larger than said tolerance.

3. A tester according to claim 2 wherein said timing circuit is adapted to measure said time interval between said multitude of pulses beginning selectively with a positive pulse transition or a negative pulse transition.

4. A tester according to claim 3 wherein said chip has multiple output terminals and said feedback circuit includes a multiplexor for passing said pulses from any selectable one of said multiple output terminals to said pulse generator control terminal.

5. A tester according to claim 4 and further including an electromechanical plug which inserts into said fixture and shorts said pulses through said fixture.

6. A tester according to claim 1 wherein said timing circuit is adapted to measure said time interval between said multitude of pulses beginning selectively with a positive pulse transition or a negative pulse transition.

7. A tester according to claim 1 wherein said chip has multiple output terminals and said feedback circuit includes a multiplexor for passing said pulses from a selectable one of said multiple output terminals to said pulse generator control terminal.

8. A tester according to claim 1 and further including an electromechanical plug which inserts into said fixture and shorts said pulses through said fixture.

9. A tester for use in measuring the time with which a signal propagates through an electronic component, said tester being comprised of:
   a ring oscillator in which pulses are periodically generated and propagated around a loop;
   a fixture, within said loop, for holding said electronic component in a removable fashion such that said pulses propagate through said fixture and electronic component;
   a timing circuit, coupled to said loop, for generating a timing signal each time it receives a predetermined number of said pulses from said loop;
   a means for measuring the time interval between two consecutive timing signals with a certain tolerance; and
   said predetermined number times the period of said pulses being substantially larger than said tolerance.

10. A tester according to claim 9 and further including an electromechanical plug which inserts into said fixture and shorts said pulses through said fixture.

11. A tester according to claim 10 wherein said component has multiple output terminals and said ring oscillator includes a multiplexor for passing said pulses from any selectable one of said multiple output terminals around said loop.

* * * * *

UNITED STATES PATENT AND TRADEMARK OFFICE
CERTIFICATE OF CORRECTION

PATENT NO. : 5,083,299

DATED : January 21, 1992

INVENTOR(S) : Robert E. Schwanke, James C. Icuss

It is certified that error appears in the above-identified patent and that said Letters Patent is hereby corrected as shown below:

On the title page, Item [75] Inventors:

should read - ROLAND D. ROTHENBERGER

JAMES CARMEN ICUSS

ROBERT EUGENE SCHWANKE

Signed and Sealed this

Seventh Day of December, 1993

Attest:

BRUCE LEHMAN

*Attesting Officer*   *Commissioner of Patents and Trademarks*